United States Patent
Schneider et al.

(10) Patent No.: US 10,263,630 B2
(45) Date of Patent: Apr. 16, 2019

(54) MULTI-PATH ANALOG FRONT END WITH ADAPTIVE PATH

(71) Applicant: Cirrus Logic International Semiconductor Ltd., Edinburgh (GB)

(72) Inventors: Edmund Mark Schneider, Austin, TX (US); Daniel J. Allen, Austin, TX (US); Saurabh Singh, Cedar Park, TX (US); Aniruddha Satoskar, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 93 days.

(21) Appl. No.: 15/234,741

(22) Filed: Aug. 11, 2016

(65) Prior Publication Data

US 2018/0048325 A1    Feb. 15, 2018

(51) Int. Cl.
| | | |
|---|---|---|
| *G06F 13/40* | (2006.01) | |
| *G06F 13/42* | (2006.01) | |
| *H03M 1/12* | (2006.01) | |
| *H03M 1/08* | (2006.01) | |
| *H03M 1/18* | (2006.01) | |

(52) U.S. Cl.
CPC .......... *H03M 1/12* (2013.01); *G06F 13/4022* (2013.01); *G06F 13/4282* (2013.01); *H03M 1/0872* (2013.01); *H03M 1/0881* (2013.01); *H03M 1/188* (2013.01)

(58) Field of Classification Search
USPC ........................................................ 710/316
See application file for complete search history.

(56) References Cited

U.S. PATENT DOCUMENTS

| | | |
|---|---|---|
| 4,346,349 A | 8/1982 | Yokoyama |
| 4,441,081 A | 4/1984 | Jenkins |
| 4,446,440 A | 5/1984 | Bell |

(Continued)

FOREIGN PATENT DOCUMENTS

| | | |
|---|---|---|
| EP | 0351788 A2 | 7/1989 |
| EP | 0966105 A2 | 12/1999 |

(Continued)

OTHER PUBLICATIONS

International Search Report and Written Opinion of the International Searching Authority, International Application No. PCT/US2016/040096, dated Mar. 24, 2017.

(Continued)

*Primary Examiner* — Elias Mamo
(74) *Attorney, Agent, or Firm* — Jackson Walker L.L.P.

(57) ABSTRACT

In accordance with embodiments of the present disclosure, a processing system may include a plurality of processing paths and a controller. The plurality of processing paths may include a static processing path configured to generate a first digital signal based on an analog input signal and a dynamic processing path configured to generate a second digital signal based on the analog input signal, wherein a parameter of the dynamic processing path is determined based on a characteristic of the analog input signal. The controller may be configured to select the first digital signal as a digital output signal of the processing system when a change is occurring to the characteristic and select the second digital signal as the digital output signal in the absence of change occurring to the characteristic.

12 Claims, 2 Drawing Sheets

(56) References Cited

U.S. PATENT DOCUMENTS

| | | |
|---|---|---|
| 4,493,091 A | 1/1985 | Gundry |
| 4,890,107 A | 12/1989 | Pearce |
| 4,972,436 A | 11/1990 | Halim et al. |
| 4,999,628 A | 3/1991 | Kakaubo et al. |
| 4,999,830 A | 3/1991 | Agazzi |
| 5,077,539 A | 12/1991 | Howatt |
| 5,148,167 A | 9/1992 | Ribner |
| 5,198,814 A | 3/1993 | Ogawara et al. |
| 5,272,449 A | 12/1993 | Izawa |
| 5,321,758 A | 6/1994 | Charpentier et al. |
| 5,323,159 A | 6/1994 | Imamura et al. |
| 5,343,161 A | 8/1994 | Tokumo et al. |
| 5,550,923 A | 7/1996 | Hotvet et al. |
| 5,600,317 A | 2/1997 | Knoth et al. |
| 5,714,956 A | 2/1998 | Jahne et al. |
| 5,719,641 A | 2/1998 | Mizoguchi |
| 5,796,303 A | 8/1998 | Vinn et al. |
| 5,808,575 A | 9/1998 | Himeno et al. |
| 5,810,477 A | 9/1998 | Abraham et al. |
| 6,088,461 A | 7/2000 | Lin |
| 6,160,455 A | 12/2000 | French et al. |
| 6,201,490 B1 | 3/2001 | Kawano et al. |
| 6,271,780 B1 | 8/2001 | Gong et al. |
| 6,333,707 B1 | 12/2001 | Oberhammer et al. |
| 6,353,404 B1 | 3/2002 | Kuroiwa |
| 6,542,612 B1 | 4/2003 | Needham |
| 6,614,297 B2 | 9/2003 | Score et al. |
| 6,683,494 B2 | 1/2004 | Stanley |
| 6,745,355 B1 | 6/2004 | Tamura |
| 6,768,443 B2 | 7/2004 | Willis |
| 6,822,595 B1 | 11/2004 | Robinson |
| 6,853,242 B2 | 2/2005 | Melanson et al. |
| 6,888,888 B1 | 5/2005 | Tu et al. |
| 6,897,794 B2 | 5/2005 | Kuyel et al. |
| 6,989,955 B2 | 1/2006 | Ziemer et al. |
| 7,020,892 B2 | 3/2006 | Levesque et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,279,964 B2 | 10/2007 | Bolz et al. |
| 7,302,354 B2 | 11/2007 | Zhuge |
| 7,312,734 B2 | 12/2007 | McNeill et al. |
| 7,315,204 B2 | 1/2008 | Seven |
| 7,365,664 B2 | 4/2008 | Caduff et al. |
| 7,378,902 B2 | 5/2008 | Sorrells et al. |
| 7,385,443 B1 | 6/2008 | Denison |
| 7,403,010 B1 | 7/2008 | Hertz |
| 7,440,891 B1 | 10/2008 | Shozakai et al. |
| 7,522,677 B2 | 4/2009 | Liang |
| 7,583,215 B2 | 9/2009 | Yamamoto et al. |
| 7,671,768 B2 | 3/2010 | De Ceuninck |
| 7,679,538 B2 | 3/2010 | Tsang |
| 7,737,776 B1 | 6/2010 | Cyrusian |
| 7,893,856 B2 | 2/2011 | Ek et al. |
| 7,924,189 B2 * | 4/2011 | Sayers ............... H03M 1/188 |
| | | 341/139 |
| 7,937,106 B2 | 5/2011 | Sorrells et al. |
| 7,952,502 B2 * | 5/2011 | Kolze ............... H03M 1/1033 |
| | | 341/118 |
| 8,060,663 B2 | 11/2011 | Murray et al. |
| 8,130,126 B2 | 3/2012 | Breitschaedel et al. |
| 8,194,889 B2 | 6/2012 | Seefeldt |
| 8,298,425 B2 | 10/2012 | Kanbe |
| 8,330,631 B2 | 12/2012 | Kumar et al. |
| 8,362,936 B2 | 1/2013 | Ledzius et al. |
| 8,462,035 B2 | 6/2013 | Schimper et al. |
| 8,483,753 B2 | 7/2013 | Behzad et al. |
| 8,508,397 B2 | 8/2013 | Hisch |
| 8,717,211 B2 | 5/2014 | Miao et al. |
| 8,786,477 B1 | 7/2014 | Albinet |
| 8,836,551 B2 | 9/2014 | Nozaki |
| 8,873,182 B2 * | 10/2014 | Liao ............... G11B 20/10268 |
| | | 360/53 |
| 8,878,708 B1 | 11/2014 | Sanders et al. |
| 8,952,837 B2 | 2/2015 | Kim et al. |
| 9,071,201 B2 | 6/2015 | Jones et al. |
| 9,071,267 B1 | 6/2015 | Schneider et al. |
| 9,071,268 B1 | 6/2015 | Schneider et al. |
| 9,118,401 B1 | 8/2015 | Nieto et al. |
| 9,148,164 B1 | 9/2015 | Schneider et al. |
| 9,171,552 B1 | 10/2015 | Yang |
| 9,178,462 B2 | 11/2015 | Kurosawa et al. |
| 9,210,506 B1 | 12/2015 | Nawfal et al. |
| 9,337,795 B2 | 5/2016 | Das et al. |
| 9,391,576 B1 | 7/2016 | Satoskar et al. |
| 9,444,504 B1 * | 9/2016 | Robinson ............ H04B 1/1036 |
| 9,503,027 B2 | 11/2016 | Zanbaghi |
| 9,525,940 B1 | 12/2016 | Schneider et al. |
| 9,543,975 B1 | 1/2017 | Melanson et al. |
| 9,584,911 B2 | 2/2017 | Das et al. |
| 9,596,537 B2 | 3/2017 | He et al. |
| 9,635,310 B2 | 4/2017 | Chang et al. |
| 9,680,488 B2 | 6/2017 | Das et al. |
| 9,762,255 B1 | 9/2017 | Satoskar et al. |
| 9,774,342 B1 | 9/2017 | Schneider et al. |
| 9,780,800 B1 | 10/2017 | Satoskar et al. |
| 9,807,504 B2 | 10/2017 | Melanson et al. |
| 9,813,814 B1 | 11/2017 | Satoskar |
| 9,831,843 B1 | 11/2017 | Das et al. |
| 9,917,557 B1 | 3/2018 | Zhu et al. |
| 9,929,703 B1 | 3/2018 | Zhao |
| 2001/0001547 A1 | 5/2001 | Delano et al. |
| 2001/0009565 A1 | 7/2001 | Singvall |
| 2004/0078200 A1 | 4/2004 | Alves |
| 2004/0184621 A1 | 9/2004 | Andersen et al. |
| 2005/0068097 A1 | 3/2005 | Kim et al. |
| 2005/0084037 A1 | 4/2005 | Liang |
| 2005/0258989 A1 | 11/2005 | Li et al. |
| 2005/0276359 A1 | 12/2005 | Xiong |
| 2006/0056491 A1 | 3/2006 | Lim et al. |
| 2006/0064037 A1 | 3/2006 | Shalon et al. |
| 2006/0098827 A1 | 5/2006 | Paddock et al. |
| 2006/0261886 A1 | 11/2006 | Hansen et al. |
| 2006/0284675 A1 | 12/2006 | Krochmal et al. |
| 2007/0018719 A1 | 1/2007 | Seven |
| 2007/0026837 A1 | 2/2007 | Bagchi |
| 2007/0057720 A1 | 3/2007 | Hand et al. |
| 2007/0092089 A1 | 4/2007 | Seefeldt et al. |
| 2007/0103355 A1 | 5/2007 | Yamada |
| 2007/0120721 A1 * | 5/2007 | Caduff ............... H03G 3/3026 |
| | | 341/155 |
| 2007/0123184 A1 | 5/2007 | Nesimoglu et al. |
| 2007/0146069 A1 | 6/2007 | Wu et al. |
| 2008/0012639 A1 | 1/2008 | Mels |
| 2008/0030577 A1 | 2/2008 | Cleary et al. |
| 2008/0114239 A1 | 5/2008 | Randall et al. |
| 2008/0143436 A1 | 6/2008 | Xu |
| 2008/0159444 A1 | 7/2008 | Terada |
| 2008/0198048 A1 | 8/2008 | Klein et al. |
| 2008/0292107 A1 | 11/2008 | Bizjak |
| 2009/0015327 A1 | 1/2009 | Wu et al. |
| 2009/0021643 A1 | 1/2009 | Hsueh et al. |
| 2009/0051423 A1 | 2/2009 | Miaille et al. |
| 2009/0058531 A1 | 3/2009 | Hwang et al. |
| 2009/0084586 A1 | 4/2009 | Nielsen |
| 2009/0220110 A1 | 9/2009 | Bazarjani et al. |
| 2010/0168882 A1 | 7/2010 | Zhang et al. |
| 2010/0176980 A1 | 7/2010 | Breitschadel et al. |
| 2010/0183163 A1 | 7/2010 | Matsui et al. |
| 2011/0013733 A1 | 1/2011 | Martens et al. |
| 2011/0025540 A1 | 2/2011 | Katsis |
| 2011/0029109 A1 | 2/2011 | Thomsen et al. |
| 2011/0063148 A1 | 3/2011 | Kolze et al. |
| 2011/0096370 A1 | 4/2011 | Okamoto |
| 2011/0134980 A1 * | 6/2011 | Lipka ............... H03G 3/3078 |
| | | 375/224 |
| 2011/0136455 A1 | 6/2011 | Sundstrom et al. |
| 2011/0150240 A1 | 6/2011 | Akiyama et al. |
| 2011/0170709 A1 | 7/2011 | Guthrie et al. |
| 2011/0188671 A1 | 8/2011 | Anderson et al. |
| 2011/0228952 A1 | 9/2011 | Lin |
| 2011/0242614 A1 | 10/2011 | Okada |
| 2011/0268301 A1 | 11/2011 | Nielsen et al. |

(56) References Cited

U.S. PATENT DOCUMENTS

| | | |
|---|---|---|
| 2011/0285463 A1 | 11/2011 | Walker et al. |
| 2012/0001786 A1* | 1/2012 | Hisch ................... H03M 1/188 |
| | | 341/155 |
| 2012/0047535 A1 | 2/2012 | Bennett et al. |
| 2012/0133411 A1 | 5/2012 | Miao et al. |
| 2012/0177201 A1 | 7/2012 | Ayling et al. |
| 2012/0177226 A1 | 7/2012 | Silverstein et al. |
| 2012/0188111 A1 | 7/2012 | Ledzius et al. |
| 2012/0207315 A1 | 8/2012 | Kimura et al. |
| 2012/0242521 A1 | 9/2012 | Kinyua |
| 2012/0250893 A1 | 10/2012 | Carroll et al. |
| 2012/0263090 A1 | 10/2012 | Porat et al. |
| 2012/0274490 A1 | 11/2012 | Kidambi et al. |
| 2012/0280726 A1 | 11/2012 | Colombo et al. |
| 2012/0293348 A1 | 11/2012 | Snelgrove |
| 2013/0095870 A1 | 4/2013 | Phillips et al. |
| 2013/0106635 A1 | 5/2013 | Doi |
| 2013/0129117 A1 | 5/2013 | Thomsen et al. |
| 2013/0188808 A1 | 7/2013 | Pereira et al. |
| 2013/0241753 A1 | 9/2013 | Nozaki |
| 2013/0241755 A1 | 9/2013 | Chen et al. |
| 2014/0044280 A1* | 2/2014 | Jiang ...................... H03G 3/341 |
| | | 381/94.1 |
| 2014/0105256 A1 | 4/2014 | Hanevich et al. |
| 2014/0105273 A1 | 4/2014 | Chen et al. |
| 2014/0126747 A1 | 5/2014 | Huang |
| 2014/0135077 A1 | 5/2014 | Leviant et al. |
| 2014/0184332 A1 | 7/2014 | Shi et al. |
| 2014/0269118 A1 | 9/2014 | Taylor et al. |
| 2014/0368364 A1 | 12/2014 | Hsu |
| 2015/0009079 A1 | 1/2015 | Bojer |
| 2015/0170663 A1 | 6/2015 | Disch et al. |
| 2015/0214974 A1 | 7/2015 | Currivan |
| 2015/0214975 A1 | 7/2015 | Gomez et al. |
| 2015/0249466 A1 | 9/2015 | Elyada |
| 2015/0295584 A1 | 10/2015 | Das et al. |
| 2015/0327174 A1 | 11/2015 | Rajagopal et al. |
| 2015/0381130 A1 | 12/2015 | Das et al. |
| 2016/0072465 A1 | 3/2016 | Das et al. |
| 2016/0080862 A1 | 3/2016 | He et al. |
| 2016/0080865 A1 | 3/2016 | He et al. |
| 2016/0139230 A1 | 5/2016 | Petrie et al. |
| 2016/0173112 A1 | 6/2016 | Das et al. |
| 2016/0181988 A1 | 6/2016 | Du et al. |
| 2016/0286310 A1 | 9/2016 | Das et al. |
| 2016/0365081 A1 | 12/2016 | Satoskar et al. |
| 2017/0047895 A1 | 2/2017 | Zanbaghi |
| 2017/0150257 A1 | 5/2017 | Das et al. |
| 2017/0212721 A1 | 7/2017 | Satoskar et al. |
| 2018/0046239 A1 | 2/2018 | Schneider |
| 2018/0048325 A1 | 2/2018 | Schneider |
| 2018/0098149 A1 | 4/2018 | Das |

FOREIGN PATENT DOCUMENTS

| | | |
|---|---|---|
| EP | 1244218 A1 | 9/2002 |
| EP | 1575164 A2 | 9/2005 |
| EP | 1689075 A1 | 8/2006 |
| EP | 1753130 A1 | 2/2007 |
| EP | 1798852 A | 6/2009 |
| EP | 2207264 A1 | 7/2010 |
| GB | 1599401 A | 9/1981 |
| GB | 2307121 A | 6/1997 |
| GB | 2507096 A | 4/2014 |
| GB | 2527637 A | 12/2015 |
| GB | 2527677 B | 10/2016 |
| GB | 2537694 A | 10/2016 |
| GB | 2537697 A | 10/2016 |
| GB | 2539517 A | 12/2016 |
| GB | 2552860 A | 2/2018 |
| GB | 2552867 A | 2/2018 |
| JP | 2008294803 A | 12/2008 |
| WO | WO0054403 A1 | 9/2000 |
| WO | 02/37686 A2 | 5/2002 |
| WO | 2006018750 A1 | 2/2006 |
| WO | 2007005380 A2 | 1/2007 |
| WO | 2007136800 A2 | 11/2007 |
| WO | 2008067260 A1 | 6/2008 |
| WO | 2014113471 A1 | 7/2014 |
| WO | 2015160655 A1 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |
| WO | 2017116629 A1 | 7/2017 |
| WO | 2018031525 A1 | 2/2018 |
| WO | 2018031646 A1 | 2/2018 |

OTHER PUBLICATIONS

International Search Report and Written Opinion of the International Searching Authority, International Application No. PCT/US2017/014240, dated Apr. 24, 2017.

Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Thaden, Rainer et al., A Loudspeaker Management System with FIR/IRR Filtering; AES 32nd International Conference, Hillerod, Denmark, Sep. 21-23, 2007; pp. 1-12.

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1510578.6, dated Aug. 3, 2015, 3 pages.

International Search Report and Written Opinion, International Application No. PCT/US2015/056357, dated Jan. 29, 2015, 13 pages.

Combined Search and Examination Report, GB Application No. GB1514512.1, dated Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report under Sections 17 and 18(3) of the UKIPO, Application No. GB1620427.3, dated Jun. 1, 2017.

(56) References Cited

OTHER PUBLICATIONS

Combined Search and Examination Report under Sections 17 and 18(3) of the UKIPO, Application No. GB1620428.1, dated Jul. 21, 2017.
Combined Search and Examination Report under Sections 17 and 18(3), United Kingdom Intellectual Property Office, Application No. GB1700371.6, dated Aug. 1, 2017.
Combined Search and Examination Report under Sections 17 and 18(3), United Kingdom Intellectual Property Office, Application No. GB1702540.4, dated Oct. 2, 2017.
Combined Search and Examination Report under Sections 17 and 18(3), United Kingdom Intellectual Property Office, Application No. GB1702655.0, dated Oct. 24, 2017.
Combined Search and Examination Report under Sections 17 and 18(3), United Kingdom Intellectual Property Office, Application No. GB1706693.7, dated Oct. 26, 2017.
Combined Search and Examination Report under Sections 17 and 18(3), United Kingdom Intellectual Property Office, Application No. GB1706690.3, dated Oct. 30, 2017.
Search Report under Section 17, United Kingdom Intellectual Property Office, Application No. GB1702656.8, dated Oct. 31, 2017.
International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Combined Search and Examination Report under Sections 17 and 18(3), United Kingdom Intellectual Property Office, Application No. GB1708544.0, dated Nov. 28, 2017.
International Search Report and Written Opinion of the International Searching Authority, International Patent Application No. PCT/US2017/052439, dated Dec. 14, 2017.
Chen, Kuo-Hsin, et al., A 106dB PSRR Direct Battery Connected Reconfigurable Class-AB/D Speaker Amplifier for Hands-Free/Receiver 2-in-1 Loudspeaker, Solid State Circuits Conference (A-SSCC), 2011 IEEE Asian, Nov. 14, 2011, pp. 221-224.
Combined Search and Examination Report, GB Application No. GB1602288.1, dated Aug. 9, 2016, 6 pages.
International Search Report and Written Opinion of the International Searching Authority, International Application No. PCT/US2016/065134, dated Mar. 15, 2017.
Examination Report under Section 18(3), UKIPO, Application No. GB1702656.8, dated Jan. 17, 2019.

\* cited by examiner

MULTI-PATH ANALOG FRONT END WITH ADAPTIVE PATH

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. Pat. No. 5,714,956 entitled "Process and System for the Analog-to-Digital Conversion of Signals" to Jahne et al. ("Jahne patent"), U.S. Pat. No. 5,600,317 entitled "Apparatus for the Conversion of Analog Audio Signals to a Digital Data Stream" to Knoth et al. ("Knoth patent") and U.S. Pat. No. 6,271,780 entitled "Gain Ranging Analog-to-Digital Converter with Error Correction" to Gong et al. ("Gong patent"). The use of multipath circuits may reduce noise as one path may be optimized for processing small amplitude signals (e.g., for processing low noise signals) while another circuit path with another set of ADC and AFE is optimized for large amplitude signals (e.g., allowing for higher dynamic range).

An example application for multipath ADCs/AFEs is use of them in a circuit for an audio system application, such as an audio mixing board or in a digital microphone system. Such an example application is disclosed in the Jahne patent. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allow the overall circuit to burn less power, consume less area, and save on other such design costs.

SUMMARY

In accordance with the teachings of the present disclosure, certain disadvantages and problems associated with implementation of a multiple AFE/ADC path may be reduced or eliminated.

In accordance with embodiments of the present disclosure, a processing system may include a plurality of processing paths and a controller. The plurality of processing paths may include a static processing path configured to generate a first digital signal based on an analog input signal and a dynamic processing path configured to generate a second digital signal based on the analog input signal, wherein a parameter of the dynamic processing path is determined based on a characteristic of the analog input signal. The controller may be configured to select the first digital signal as a digital output signal of the processing system when a change is occurring to the characteristic and select the second digital signal as the digital output signal in the absence of change occurring to the characteristic.

In accordance with these and other embodiments of the present disclosure, a method may include generating a first digital signal based on an analog input signal with a static processing path, generating a second digital signal based on an analog input signal with a dynamic processing path, wherein a parameter of the dynamic processing path is determined based on a characteristic of the analog input signal, and selecting the first digital signal as a digital output signal of the processing system when a change is occurring to the characteristic and selecting the second digital signal as the digital output signal in the absence of change occurring to the characteristic.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
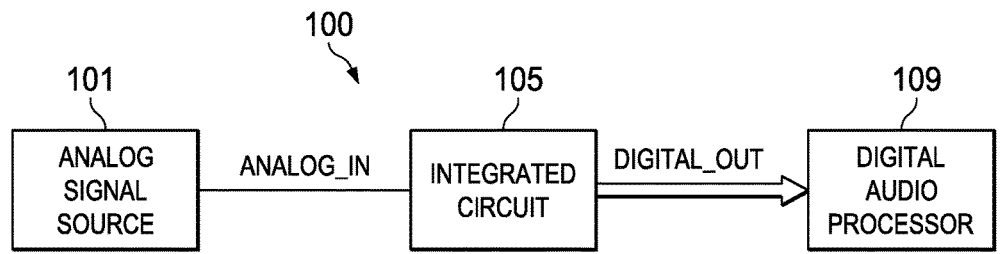
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an integrated circuit (IC) 105, and a digital audio processor 109. Analog signal source 101 may comprise any system, device, or apparatus configured to generate an analog electrical signal, for example an analog input signal ANALOG_IN. For example, in embodiments in which signal processing system 100 is a processing system, analog signal source 101 may comprise a microphone transducer.

Integrated circuit 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, integrated circuit 105 may be disposed in close proximity with analog signal source 101 to ensure that the length of the analog line between analog signal source 101 and integrated circuit 105 is relatively short to minimize the amount of noise that can be picked up on an analog output line carrying analog input signal ANALOG_IN. For example, in some embodiments, analog signal source 101 and integrated circuit 105 may be formed on the same substrate. In other embodiments, analog signal source 101 and integrated circuit 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Signal processing system 100 may be used in any application in which it is desired to process an analog signal to generate a digital signal. Thus, in some embodiments, signal processing system 100 may be integral to an audio device that converts analog signals (e.g., from a microphone) to digital signals representing the sound incident on a microphone. As another example, signal processing system 100 may be integral to a radio-frequency device (e.g., a mobile telephone) to convert radio-frequency analog signals into digital signals.

Figure 2:
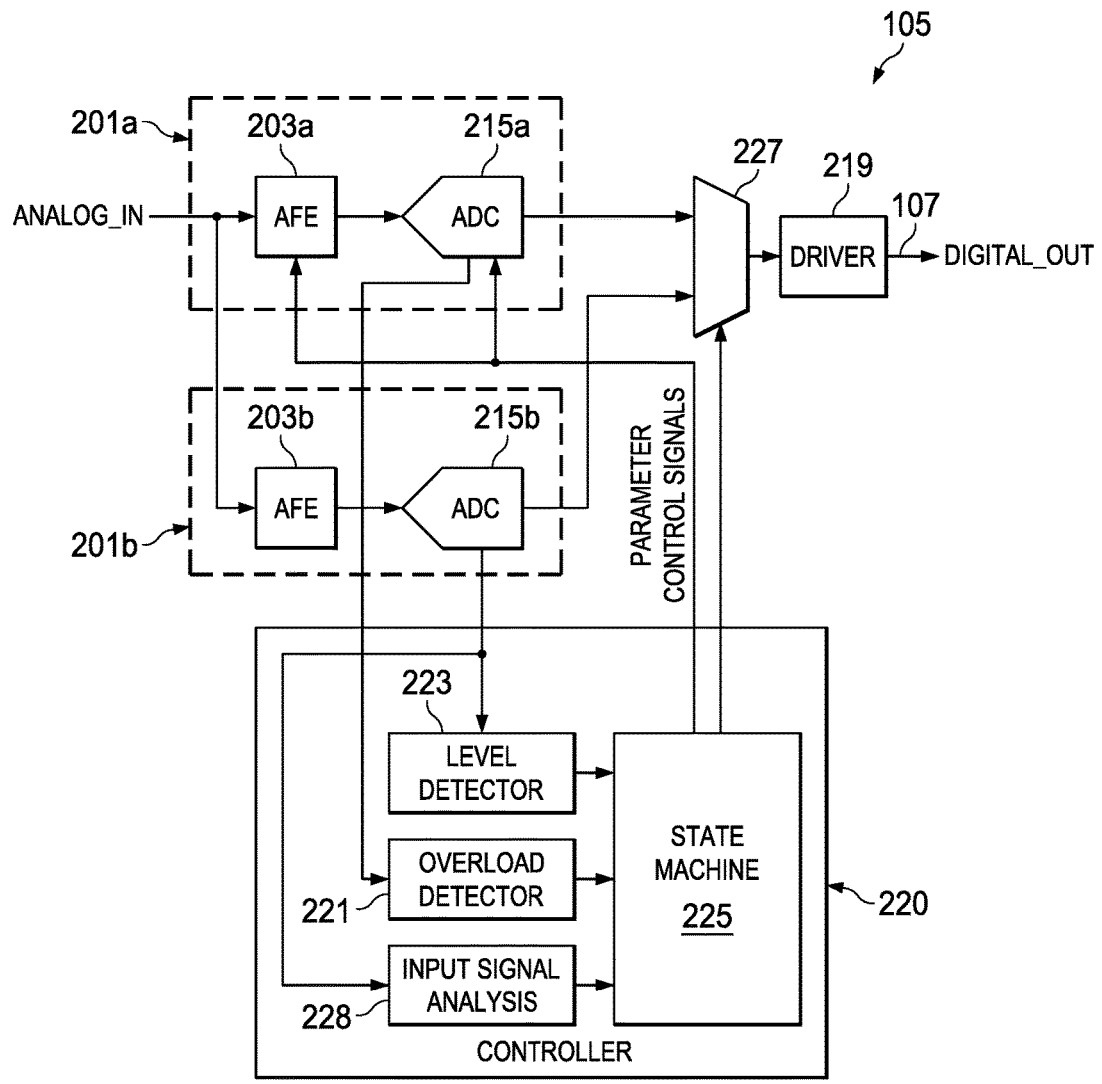
FIG. 2 illustrates a block diagram of selected components of an integrated circuit for processing an analog signal to generate a digital signal, in accordance with embodiments of the present disclosure.

FIG. 2 illustrates a block diagram of selected components of integrated circuit 105, in accordance with embodiments of the present disclosure. As shown in FIG. 2, integrated circuit 105 may include two or more processing paths 201*a* and 201*b* (which may be referred to herein individually as a processing path 201 and collectively as processing paths 201), each processing path 201 including a respective AFE 203 (e.g., AFE 203*a*, AFE 203*b*) and a respective ADC (e.g., ADC 215*a*, ADC 215*b*). An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. Selected components for example embodiments of AFEs 203*a* and 203*b* are discussed in greater detail below with respect to FIG. 3. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. Selected components for the example embodiments of ADCs 215*a* and 215*b* are discussed in greater detail below with respect to FIG. 3.

A multiplexer 227 may receive a respective digital signal from each of processing paths 201 and may select one of the digital signals as digital output signal DIGITAL_OUT based on a control signal generated by and communicated from a controller 220.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal 107.

Controller 220 may comprise any suitable system, device, or apparatus for selecting one of the digital signals output by the various processing paths 201 as digital output signal DIGITAL_OUT. In some embodiments, controller 220 may make such selection based on a magnitude of analog input signal ANALOG_IN or a signal derivative thereof. For example, controller 220 may include an overload detector 221 that may determine whether or not a signal derivative of analog input signal ANALOG_IN (e.g., an output of a modulator 316*a* of delta-sigma modulator 308*a*, as shown in greater detail in FIG. 3) is likely to cause clipping or other distortion of digital output signal DIGITAL_OUT if a particular processing path (e.g., processing path 201*a*) is selected. If clipping or other distortion of digital output signal DIGITAL_OUT is likely if the particular processing path (e.g., processing path 201*a*) is selected, state machine 225 of controller 220 may generate a control signal so that another processing path (e.g., processing path 201*b*) is selected. To further illustrate, in some embodiments, processing path 201*a* may be a path adapted for low amplitudes of analog input signal ANALOG_IN and may thus have a high signal gain, while processing path 201*b* may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201*a* is selected, overload detector 221 may detect such condition, and cause state machine 225 to generate a control signal to select the digital signal generated by processing path 201*b* as digital output signal DIGITAL_OUT.

In operation, processing path 201*a* may be a dynamic processing path, in that one or more parameters of processing path 201*a* may be variable based on one or more characteristics of analog input signal ANALOG_IN, as described in greater detail elsewhere in this disclosure. Furthermore, processing path 201*b* may be a static processing path, in that similar parameters of processing path 201*b* may remain substantially fixed regardless of the one or more characteristics of analog input signal ANALOG_IN. Such one or more parameters may include a gain of processing path 201*a*, a bandwidth of processing path 201*a*, a filter configuration gain of processing path 201*a*, a noise floor of processing path 201*a*, a distortion of processing path 201*a*, and a power consumed by processing path 201*a*. Such one or more characteristics of analog input signal ANALOG_IN may include a magnitude of analog input signal ANALOG_IN, a spectral content of analog input signal ANALOG_IN, a noise floor of analog input signal ANALOG_IN, a distortion of analog input signal ANALOG_IN, a signal-to-noise ratio of analog input signal ANALOG_IN, and a required resolution of analog input signal ANALOG_IN.

To that end, controller 220 may include a level detector 223 that may detect an amplitude of analog input signal ANALOG_IN or a signal derivative thereof (e.g., a signal generated within ADC 215*b*) and communicate a signal indicative of such amplitude to state machine 225 and may also include an input signal analysis block 228 which may analyze or otherwise process a digital signal derived from analog input signal ANALOG_IN to determine one or more characteristics of analog input signal ANALOG_IN other than its magnitude and communicate a signal indicative of such amplitude to state machine 225. Based on such characteristics, state machine 225 of controller 220 may issue parameter control signals to one or more components of processing path 201a in order to set one or more parameters of processing path 201a based on the one or more characteristics of analog input signal ANALOG_IN.

In addition, state machine 225 of controller 220 may be configured to select the digital signal generated by processing path 201b as digital output signal DIGITAL_OUT when a change is occurring to a characteristic of analog input signal ANALOG_IN (such that a corresponding change is made to one or more parameters of processing path 201a in response to the change in the characteristic) and select the digital signal generated by processing path 201a as digital output signal DIGITAL_OUT in the absence of change occurring to characteristics of analog input signal ANALOG_IN. Thus, when a change is occurring to a characteristic of analog input signal ANALOG_IN such that a corresponding change is made to one or more parameters of processing path 201a in response to the change in the characteristic, controller 220 may select static processing path 201b to generate digital output signal DIGITAL_OUT so that a listener would not be subject to audio artifacts that may occur if a processing path with varying parameters was used to generate digital output signal DIGITAL_OUT. Accordingly, as one or more characteristics of analog input signal ANALOG_IN change, one or more parameters of dynamic processing path 201a may be optimized for performance, power, and/or other attribute (e.g., in order to maximize signal quality while minimizing power consumption).

To minimize the occurrence of audio artifacts occurring due to a change in a parameter of dynamic processing path 201a, controller 220 may be configured such that it changes selection from the digital signal generated by static processing path 201b as digital output signal DIGITAL_OUT to the digital signal generated by dynamic processing path 201a as digital output signal DIGITAL_OUT only after any transient effects of the change in a parameter of dynamic processing path 201a have settled. For example, in some embodiments, to ensure any such transient effects have settled, controller 220 may switch from static processing path 201b to dynamic processing path 201a in response to passage of a duration of time after the parameter of dynamic processing path 201a is changed.

Figure 3:
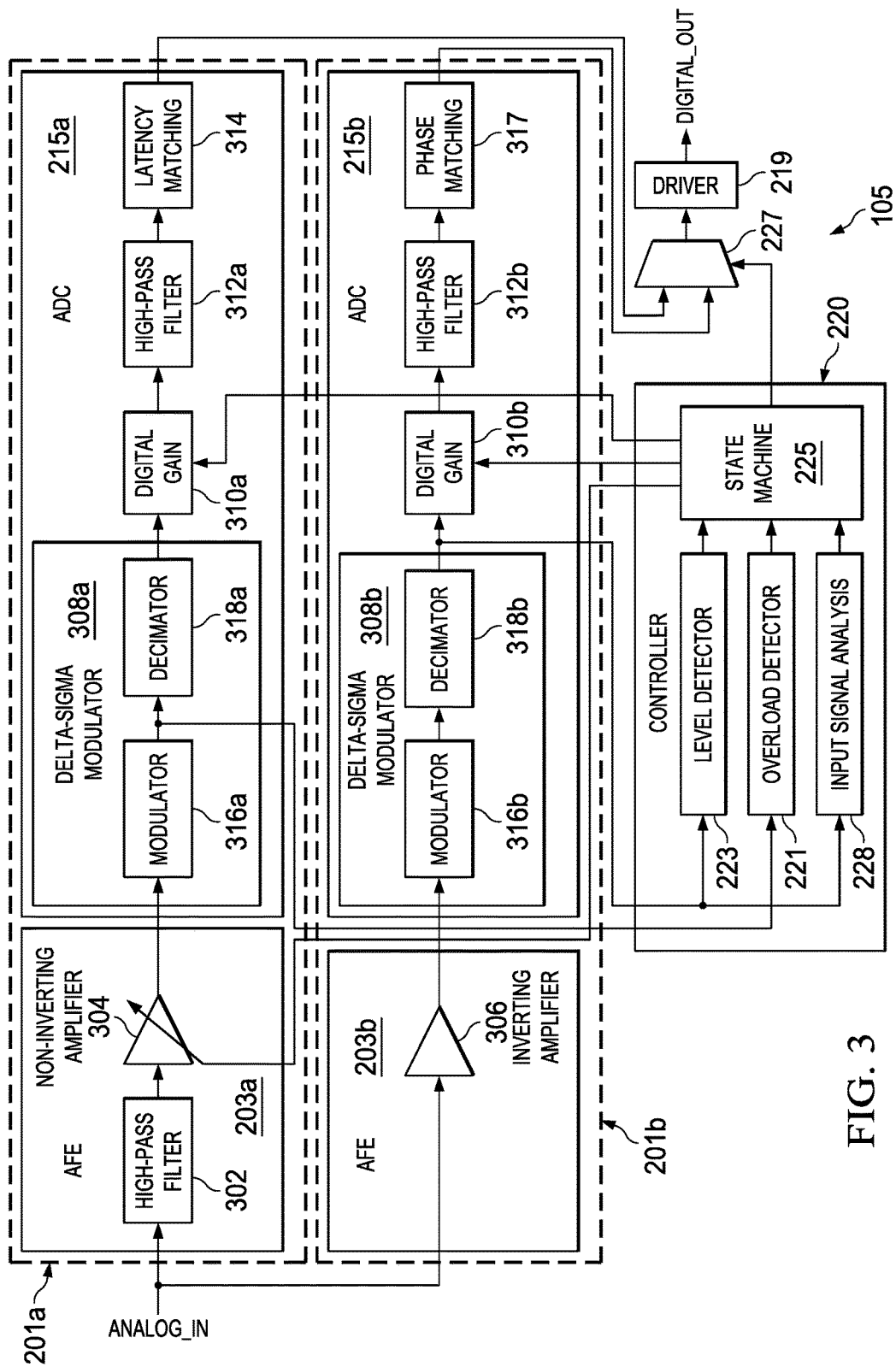
FIG. 3 illustrates a block diagram of selected components of the integrated circuit of FIG. 2 depicting selected components of example embodiments of analog front ends and analog-to-digital converters, in accordance with embodiments of the present disclosure.

FIG. 3 illustrates a block diagram of selected components of integrated circuit 105 depicting selected components of example embodiments of AFEs 203 and ADCs 215, in accordance with embodiments of the present disclosure. As shown in FIG. 3, analog front end 203a of processing path 201a may include a high-pass filter 302 configured to high-pass filter analog input signal ANALOG_IN to remove direct current offsets or biases, which are often particularly troublesome for high-gain amplifiers, and output such filtered signal to a non-inverting amplifier 304. Non-inverting amplifier 304 may amplify analog input signal ANALOG_IN by a non-inverting gain and communicate such amplified analog signal to ADC 215a. In some embodiments, high-pass filter 302 may be formed on the same integrated circuit as one or more of AFE 203a, AFE 203b, ADC 215a, and ADC 215b. Because of the presence of high-pass filter 302 in processing path 201a, but not processing path 201b, processing paths 201 may each have a different frequency response to analog input signal ANALOG_IN.

Also as shown in FIG. 3, analog front end 203b of processing path 201b may include an inverting amplifier 306 which may amplify analog input signal ANALOG_IN by an inverting gain and communicate such amplified analog signal to ADC 215b. In some embodiments, inverting amplifier 306 may be configured to apply a multiplicative gain of less than unity to analog input signal ANALOG_IN. By attenuating higher-amplitude signals, a greater dynamic range for analog input signal ANALOG_IN may be achieved, in spite of conventional wisdom that would generally dictate that signal loss should be avoided in a low-noise system. In these and other embodiments, although not depicted in FIG. 3, inverting amplifier 306 may receive the output of high-pass filter 302 instead of the unfiltered analog input signal ANALOG_IN.

Although AFEs 203a and 203b are described above having a non-inverting gain and an inverting gain, respectively, each of processing paths 201 may have approximately the same cumulative gain. Those of skill in the art may appreciate that simply applying a digital gain with a negative sign in either of ADC 215a or ADC 215b will negate the opposite polarities of the gains of AFEs 203.

As depicted in FIG. 3, each ADC 215 may include a respective delta-sigma modulator 308 (e.g., delta-sigma modulators 308a and 308b), a respective digital gain element 310 (e.g., digital gain elements 310a and 310b), and respective high-pass filters 312 (e.g., high-pass filters 312a and 312b). Each delta-sigma modulator 308 may be configured to modulate an analog signal into a corresponding digital signal. As known in the art, each delta-sigma modulator 308 may include a respective modulator 316 (e.g., modulators 316a, 316b) and a decimator 318 (e.g., decimators 318a, 318b). Each digital gain element 310 may apply a gain to a digital signal generated by its associated delta-sigma modulator 308. Each high-pass filter 312 may high-pass filter a digital signal generated by its associated digital gain element, to filter out any direct-current offsets present in the digital signal. High-pass filter 312b may also compensate for high-pass filter 302 present in AFE 203a.

In addition, ADC 215a may comprise a latency matching element 314 to match any signal latencies between processing path 201a and processing path 201b, while ADC 215b may comprise a phase matching element 317 to account for any phase offset between processing path 201a and processing path 201b. For example, phase matching element 317 may dynamically compensate for any phase mismatch between processing paths 201a and 201b by varying a delay of at least one of processing path 201a and processing path 201b. In some embodiments, phase matching element 317 may comprise a high-pass filter.

In some embodiments, a magnitude of a gain of non-inverting amplifier 304 may be substantially larger than (e.g., significantly more than manufacturing tolerances, one or more orders of magnitude) a magnitude of a gain of inverting amplifier 306. In addition, in these and other embodiments, a magnitude of digital gain element 310b may be substantially larger than (e.g., significantly more than manufacturing tolerances, one or more orders of magnitude) a magnitude of a gain of digital gain element 310a. Consequently, in such embodiments, a first path gain equal to the product of the magnitude of the gain of inverting amplifier 306 and the magnitude of a gain of digital gain element 310b may be substantially equal (e.g., within manufacturing tolerances) to a second path gain equal to the product of the magnitude of gain of non-inverting amplifier 304 and the gain of digital gain element 310a. As a specific example, in some embodiments, the inverting gain of inverting amplifier 306 may be approximately −6 decibels, the non-inverting gain of non-inverting amplifier 304 may be approximately 20 decibels, the gain of digital gain element 310a may be approximately −26 decibels, and the gain of digital gain element 310b may be approximately 0 decibels.

Accordingly, each processing path 201 may be adapted to process a particular amplitude of analog input signal ANALOG_IN. For example, AFE 203a may be suited to process lower signal amplitudes, as non-inverting amplifier 304 may have a practically infinite input resistance, may have a relatively low level of input-referred noise as compared to inverting amplifier 306, and its larger gain may permit effective processing of smaller signals, but characteristics of AFE 203a may not be amenable to higher amplitudes. The high input resistance of non-inverting amplifier 304 may facilitate the use of a smaller capacitor area for high-pass filter 302 (as compared to traditional approaches for implementing high-pass filters) and thus may permit integration of circuitry of high-pass filter 302 into the same integrated circuit as non-inverting amplifier 304, inverting amplifier 306, ADC 215a, and/or ADC 215b. In addition, the ability to integrate circuitry into a single integrated circuit may allow for centralized control of the stimuli for switching between processing paths 201 by controller 220, and may allow for more direct timing control of the actual switching and transitioning between processing paths 201. For example, because circuitry is integrated into a single integrated circuitry, level detector 223 may receive an output of delta-sigma modulator 308b as an input signal, rather than receiving an output of ADC 215b.

On the other hand, AFE 203b may be suited to process higher signal amplitudes, as its lower gain will reduce the likelihood of signal clipping, and may provide for greater dynamic range for analog input signal ANALOG_IN as compared to traditional approaches.

As shown in FIG. 3, an analog gain of non-inverting amplifier 304 and the digital gain of digital gain element 310a may be variable in response to gain control signals communicated from state machine 225 of controller 220. As an example of modifying parameters of dynamic processing path 201a in response to a change in a characteristic of analog input signal ANALOG_IN, state machine 225 may vary the analog gain of non-inverting amplifier 304 and the digital gain of digital gain element 310a responsive to changes in a magnitude of analog input signal ANALOG_IN. Accordingly, in response to a change in the magnitude of analog input signal ANALOG_IN, controller 220 may switch selection from dynamic processing path 201a to static processing path 201b, optimize the analog gain of non-inverting amplifier 304 and the digital gain of digital gain element 310a in accordance with the magnitude of analog input signal ANALOG_IN, and then switch selection from static processing path 201b to dynamic processing path 201a to take advantage of the optimized parameters. Some examples of gain optimization for dynamic processing path 201a may include, without limitation: (a) setting the analog gain of non-inverting amplifier 304 and the digital gain of digital gain element 310a to accommodate a historical maximum magnitude for analog input signal ANALOG_IN, (b) setting the analog gain of non-inverting amplifier 304 and the digital gain of digital gain element 310a to accommodate a maximum magnitude for analog input signal ANALOG_IN occurring during a period of time; (c) setting the analog gain of non-inverting amplifier 304 and the digital gain of digital gain element 310a to accommodate a multiple of some metric regarding the magnitude for analog input signal ANALOG_IN (e.g., a root-mean-square value), (d) continually adjusting the analog gain of non-inverting amplifier 304 and the digital gain of digital gain element 310a based on dynamics of analog input signal ANALOG_IN, and (e) setting the analog gain of non-inverting amplifier 304 and the digital gain of digital gain element 310a such that digital output signal DIGITAL_OUT is derived from static processing path 201b less than a small proportion of time.

For the purposes of clarity and exposition, FIG. 3 depicts analog gain and digital gain as the controllable parameter of dynamic processing path 201a as a function of a magnitude of analog input signal ANALOG_IN. However, in other embodiments, one or more other parameters of dynamic processing path 201a may be controllable as a function of one or more other characteristics of analog input signal ANALOG_IN. Examples include but are not limited to: (a) controlling a bandwidth of dynamic processing path 201a as a function of a spectral content of the analog input signal ANALOG_IN, (b) controlling a filter gain (e.g., gain of high-pass filter 302, high-pass filter 312a, and/or latency matching filter 314) of dynamic processing path 201a as a function of a spectral content of the analog input signal ANALOG_IN, (c) controlling a noise floor (e.g., by increasing or reducing power consumption) of dynamic processing path 201a as a function of a noise floor of analog input signal ANALOG_IN, (d) controlling distortion induced (e.g., by increasing or reducing power consumption) by dynamic processing path 201a as a function of distortion present in analog input signal ANALOG_IN, and (e) a power consumed by dynamic processing path 201b as a function of a required resolution of analog input signal ANALOG_IN (e.g., a resolution required by downstream processing components).

Despite a designer's best efforts to match the first path gain and the second path gain, process variations, temperature variations, manufacturing tolerances, and/or other variations may lead to the first path gain and the second path gain being unequal. If switching between paths occurs when such path gains are unequal, signal artifacts may occur due to an instantaneous, discontinuous change in magnitude of the digital output signal between two gain levels. For example, in audio signals, such artifacts may include human-perceptible "pops" or "clicks" in acoustic sounds generated from audio signals.

In some embodiments, in order to reduce or eliminate the occurrence of such artifacts when switching selection between the digital output signal of ADC 215a and the digital output signal of ADC 215b, and vice versa, controller 220 may program an additional gain into one or both of processing paths 201 to compensate for differences in the first path gain and second path gain. This additional gain factor may equalize the first path gain and the second path gain. To illustrate, controller 220 may determine a scale factor indicative of the magnitude of difference (e.g., whether an intentional difference or unintentional mismatch) between first path gain of processing path 201a and the second path gain of processing path 201b. The controller may determine the first path gain and the second path gain by comparing the digital output signals of each processing path to analog input signal ANALOG_IN or a derivative thereof. If such digital output signals have been filtered by a high-pass filter (e.g., high-pass filters 312), a direct-current offset between the signals may be effectively filtered out, which may be necessary to accurately compute the relative path gains. Controller 220 may determine the scale factor by calculating one of a root mean square average of the first path gain and the second path gain and a least mean squares estimate of the difference between the first path gain and the second path gain. Prior to switching selection between the first digital signal generated by ADC 215*a* and the second digital signal generated by ADC 215*b* (or vice versa), controller 220 may program an additional gain into one of processing paths 201 to compensate for the gain difference indicated by the scale factor. For example, controller 220 may calibrate one or both of the first path gain and the second path gain by applying a gain equal to the scale factor or the reciprocal of the gain factor (e.g., 1/gain factor), as appropriate. Such scaling may be performed by modifying one or both of digital gains 310. In some embodiments, controller 220 may apply the additional gain to the processing path 201 of the digital signal not selected as digital output signal DIGITAL_OUT. For example, controller 220 may apply the additional gain to processing path 201*a* when the digital signal of ADC 215*b* is selected as digital output signal DIGITAL_OUT and apply the additional gain to processing path 201*b* when the digital signal of ADC 215*a* is selected as digital output signal DIGITAL_OUT.

In some embodiments, the additional gain, once applied to a path gain of a processing path 201, may be allowed over a period of time to approach or "leak" to a factor of 1, in order to constrain the additional gain and compensate for any cumulative (e.g., over multiple switching events between digital signals of ADCs 215) bias in the calculation of the additional gain. Without undertaking this step to allow the additional gain to leak to unity, multiple switching events between paths may cause the gain factor to increase or decrease in an unconstrained manner as such additional gain, if different than unity, affects the outputs of the multiple paths and thus affects the calculation of the scaling factor.

In some embodiments, switching selection of digital output signal DIGITAL_OUT from the digital signal of ADC 215*a* to the digital signal of ADC 215*b* (or vice versa) may occur substantially immediately. However, in some embodiments, to reduce or eliminate artifacts from occurring when switching selection of digital output signal DIGITAL_OUT from the digital signal of ADC 215*a* to the digital signal of ADC 215*b* (or vice versa), controller 220 and multiplexer 227 may be configured to transition, continuously or in steps, digital output signal DIGITAL_OUT from a first digital signal to a second digital signal such that during such transition, digital output signal DIGITAL_OUT is a weighted average of the first digital signal and the second digital signal wherein a weight of the second digital signal relative to a weight of the first digital signal increases during the transition. For example, if a transition is desired between the digital signal of ADC 215*a* and the digital signal of ADC 215*b* as digital output signal DIGITAL_OUT, such transition may be in steps, wherein in each step, controller 220 and/or multiplexer 227 weighs digital signals output by ADCs 215 as follows:

1) 100% digital signal of ADC 215*a* and 0% digital signal of ADC 215*b*;
2) 80% digital signal of ADC 215*a* and 20% digital signal of ADC 215*b*;
3) 60% digital signal of ADC 215*a* and 40% digital signal of ADC 215*b*;
4) 30% digital signal of ADC 215*a* and 70% digital signal of ADC 215*b*;
5) 10% digital signal of ADC 215*a* and 90% digital signal of ADC 215*b*; and
6) 0% digital signal of ADC 215*a* and 100% digital signal of ADC 215*b*.

As another example, if a transition is desired between digital signal of ADC 215*b* and the digital signal of ADC 215*a* as the digital output signal DIGITAL_OUT, such transition may be in steps, wherein in each step, controller 220 and/or multiplexer 227 weighs digital signals output by ADCs 215 as follows:

1) 100% digital signal of ADC 215*b* and 0% digital signal of ADC 215*a*;
2) 70% digital signal of ADC 215*b* and 30% digital signal of ADC 215*a*;
3) 60% digital signal of ADC 215*b* and 40% digital signal of ADC 215*a*;
4) 20% digital signal of ADC 215*b* and 80% digital signal of ADC 215*a*;
5) 5% digital signal of ADC 215*b* and 95% digital signal of ADC 215*a*; and
6) 0% digital signal of ADC 215*b* and 100% digital signal of ADC 215*a*.

In some embodiments, a transition in digital output signal DIGITAL_OUT (either continuously or in steps) from the digital signal of ADC 215*a* to the digital signal of ADC 215*b* (or vice versa) may occur over a defined maximum duration of time. In these and other embodiments, when transitioning (either continuously or in steps) digital output signal DIGITAL_OUT from the digital signal of ADC 215*b* to the digital signal of ADC 215*a*, a rate of transition may be based on a magnitude of analog input signal ANALOG_IN (e.g., the rate of transition may be faster at lower amplitudes and slower at higher amplitudes). In such embodiments, the minimum rate of such transition may be limited such that the transition occurs over a defined maximum duration of time, wherein the maximum duration of time is independent of the magnitude of the analog input signal.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:
1. A processing system comprising:
a plurality of processing paths comprising:
a static processing path configured to generate a first digital signal based on an analog input signal, wherein a gain parameter of the static processing path does not vary based on the analog input signal; and a dynamic processing path configured to generate a second digital signal based on the analog input signal, wherein a parameter of the dynamic processing path is dynamically determined based on a characteristic of the analog input signal such that different values of the characteristic of the analog input signal correspond to different values of the parameter of the dynamic processing path; and a controller configured to select the first digital signal as a digital output signal of the processing system when a change is occurring to the characteristic and select the second digital signal as the digital output signal in an absence of change occurring to the characteristic;

wherein the parameter of the dynamic processing path comprises one of a gain of the dynamic processing path, a bandwidth of the dynamic processing path, a filter configuration gain of the dynamic processing path, a noise floor of the dynamic processing path, a distortion of the dynamic processing path, and a power consumed by the dynamic processing path.

2. The processing system of claim 1, wherein the characteristic comprises one of a magnitude of the analog input signal, a spectral content of the analog input signal, a noise floor of the analog input signal, a distortion of the analog input signal, a signal-to-noise ratio of the analog input signal, and a required resolution of the analog input signal.

3. The processing system of claim 1, wherein the controller is further configured to change selection from the first digital signal as the digital output signal to the second digital signal as the digital output signal in response to passage of a duration of time after the parameter of the dynamic processing path changed in response to the change to the characteristic.

4. The processing system of claim 1, wherein the controller is further configured to, when selecting the first digital signal as the digital output signal, transition continuously or in steps the digital output signal between the second digital signal and the first digital signal during a duration of time, and such that during such transition, the digital output signal is a weighted average of the first digital signal and the second digital signal wherein a weight of the first digital signal relative to a weight of the second digital signal is configured to increase during the transition.

5. The processing system of claim 1, wherein the controller is further configured to, when selecting the second digital signal as the digital output signal, transition continuously or in steps the digital output signal between the first digital signal and the second digital signal, wherein a rate of the transition is based on a magnitude of the analog input signal, and such that during such transition, the digital output signal is a weighted average of the first digital signal and the second digital signal, wherein a weight of the second digital signal relative to a weight of the first digital signal is configured to increase during the transition.

6. The processing system of claim 5, wherein the controller is further configured to transition the digital output signal between the first digital signal and the second digital signal over a maximum duration of time, wherein the maximum duration of time is independent of the magnitude of the analog input signal.

7. A method comprising:
generating a first digital signal based on an analog input signal with a static processing path, wherein a gain parameter of the static processing path does not vary based on the analog input signal;

generating a second digital signal based on an analog input signal with a dynamic processing path, wherein a parameter of the dynamic processing path is dynamically determined based on a characteristic of the analog input signal such that different values of the characteristic of the analog input signal correspond to different values of the parameter of the dynamic processing path; and selecting the first digital signal as a digital output signal of a processing system when a change is occurring to the characteristic and selecting the second digital signal as the digital output signal in an absence of change occurring to the characteristic;

wherein the parameter of the dynamic processing path comprises one of a gain of the dynamic processing path, a bandwidth of the dynamic processing path, a filter configuration gain of the dynamic processing path, a noise floor of the dynamic processing path, a distortion of the dynamic processing path, and a power consumed by the dynamic processing path.

8. The method of claim 7, wherein the characteristic comprises one of a magnitude of the analog input signal, a spectral content of the analog input signal, a noise floor of the analog input signal, a distortion of the analog input signal, a signal-to-noise ratio of the analog input signal, and a required resolution of the analog input signal.

9. The method of claim 7, further comprising changing selection from the first digital signal as the digital output signal to the second digital signal as the digital output signal in response to passage of a duration of time after the parameter of the dynamic processing path changed in response to the change to the characteristic.

10. The method of claim 7, further comprising, when selecting the first digital signal as the digital output signal, transitioning continuously or in steps the digital output signal between the second digital signal and the first digital signal during a duration of time, and such that during such transition, the digital output signal is a weighted average of the first digital signal and the second digital signal wherein a weight of the first digital signal relative to a weight of the second digital signal increases during the transition.

11. The method of claim 7, further comprising, when selecting the second digital signal as the digital output signal, transitioning continuously or in steps the digital output signal between the first digital signal and the second digital signal, wherein a rate of the transition is based on a magnitude of the analog input signal, and such that during such transition, the digital output signal is a weighted average of the first digital signal and the second digital signal, wherein a weight of the second digital signal relative to a weight of the first digital signal increases during the transition.

12. The method of claim 11, further comprising transitioning the digital output signal between the first digital signal and the second digital signal over a maximum duration of time, wherein the maximum duration of time is independent of the magnitude of the analog input signal.

* * * * *